US012648175B2

(12) United States Patent
Sharma et al.

(10) Patent No.: US 12,648,175 B2
(45) Date of Patent: Jun. 2, 2026

(54) TRANSISTOR BODY-INDUCED BODY LEAKAGE MITIGATION AT LOW TEMPERATURE

(71) Applicant: Intel Corporation, Santa Clara, CA (US)

(72) Inventors: Abhishek Anil Sharma, Portland, OR (US); Wilfred Gomes, Portland, OR (US); Pushkar Ranade, San Jose, CA (US); Willy Rachmady, Beaverton, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 261 days.

(21) Appl. No.: 17/711,887

(22) Filed: Apr. 1, 2022

(65) Prior Publication Data

US 2023/0317851 A1      Oct. 5, 2023

(51) Int. Cl.

| | |
|---|---|
| *H10D 30/67* | (2025.01) |
| *H01L 21/02* | (2006.01) |
| *H01L 23/473* | (2006.01) |
| *H10D 30/01* | (2025.01) |
| *H10D 62/10* | (2025.01) |

(Continued)

(52) U.S. Cl.
CPC ....... *H10D 30/6706* (2025.01); *H10D 30/021* (2025.01); *H10D 30/031* (2025.01); *H10D 30/6735* (2025.01); *H10D 30/6741* (2025.01); *H10D 30/675* (2025.01); *H10D 30/6757* (2025.01); *H10D 62/118* (2025.01); *H10D*

*84/08* (2025.01); *H10D 84/85* (2025.01); *H10P 14/3411* (2026.01); *H10P 14/3421* (2026.01);

(Continued)

(58) Field of Classification Search
CPC ............ H10D 30/6706; H10D 30/021; H10D 30/031; H10D 30/6735; H10D 30/6741; H10D 30/675; H10D 30/6757; H10D 62/118; H10D 84/08; H10D 84/85; H10D 30/43; H10D 30/014; H10D 62/121; H01L 21/02532; H01L 21/02546; H01L 21/0259; H01L 23/473; H01L 21/02381; H01L 21/0243; H01L 21/02433; H01L 21/02639; H01L 23/445; B82Y 10/00
See application file for complete search history.

(56) References Cited

U.S. PATENT DOCUMENTS

| | | | | |
|---|---|---|---|---|
| 6,773,936 B2 * | 8/2004 | Fujiwara | ............... | H01L 21/324 |
| | | | | 438/122 |
| 6,876,013 B2 * | 4/2005 | Okano | ............... | H10D 62/8164 |
| | | | | 257/E29.189 |

(Continued)

*Primary Examiner* — William B Partridge
*Assistant Examiner* — David Paul Sedorook
(74) *Attorney, Agent, or Firm* — Essential Patents Group, LLP

(57) ABSTRACT

Integrated circuit (IC) including transistors with high-mobility/high-saturation velocity, non-silicon channel materials coupled to a silicon substrate through counter-doped sub-channel materials, which greatly reduce electrical leakage currents through the substrate when the IC is operated at very low temperatures (e.g., below −25 C). With low temperature operation, high transistor performance associated with the non-silicon channel materials can be integrated into high density IC architectures that avoid the limitations associated with semiconductor material layer transfers.

18 Claims, 10 Drawing Sheets

(51) Int. Cl.

| | | |
|---|---|---|
| *H10D 84/08* | (2025.01) | |
| *H10D 84/85* | (2025.01) | |
| *H10P 14/20* | (2026.01) | |
| *H10W 40/47* | (2026.01) | |

(52) U.S. Cl.
CPC ......... *H10P 14/3452* (2026.01); *H10W 40/47* (2026.01)

(56) References Cited

U.S. PATENT DOCUMENTS

| | | | | |
|---|---|---|---|---|
| 2003/0110788 A1* | 6/2003 | Koeneman | ........... | H10D 62/117 |
| | | | | 257/E29.022 |
| 2014/0291616 A1* | 10/2014 | Park | ..................... | H10D 30/014 |
| | | | | 438/285 |
| 2016/0351468 A1* | 12/2016 | Liang | ...................... | H01L 24/33 |
| 2017/0194430 A1* | 7/2017 | Wood | ................ | H10D 30/6735 |
| 2018/0158944 A1* | 6/2018 | Mohapatra | ............. | H10D 30/43 |
| 2018/0211900 A1* | 7/2018 | Gutala | ..................... | G11C 7/04 |
| 2019/0035926 A1* | 1/2019 | Mohapatra | ........... | H10D 62/824 |
| 2019/0198658 A1* | 6/2019 | Mohapatra | ............. | H10D 62/80 |
| 2020/0044087 A1* | 2/2020 | Guha | ................ | H10D 30/6217 |

* cited by examiner

TRANSISTOR BODY-INDUCED BODY LEAKAGE MITIGATION AT LOW TEMPERATURE

BACKGROUND

Integrated circuit (IC) devices comprising metal-oxide-semiconductor field effect transistors (MOSFETs) can suffer from body-induced body leakage (BIBL), which occurs when active regions of a transistor are coupled through a semiconductor material to a body that can become biased relative to the transistor. When this occurs, the body becomes a fourth terminal of the transistor through which a substrate leakage current can flow in response to the body bias. This is particularly problematic for FETs with non-silicon, high-mobility/high-saturation velocity, channel material that is formed upon a silicon substrate because leakage currents can be exacerbated by a high density of crystal defects within metamorphic or pseudomorphic semiconductor material that is between the silicon substrate and the transistor channel material.

Accordingly, such substrate leakage currents have hindered the use of high-mobility and/or high-saturation velocity channel materials in ICs with high transistor count (e.g., many tens or hundreds of millions of transistors). To date, many high-mobility/high-saturation velocity channel materials have been limited to ICs that are either fabricated upon expensive alternative substrate materials (e.g., SiC or GaAs) or transferred to a conventional silicon substrate through a complex layer transfer process so that a buried dielectric layer can provide electrical isolation from the substrate. These techniques however can greatly complicate FET architectures, limiting transistor counts, increasing manufacturing costs, and/or reducing IC device yield. Accordingly, alternative solutions to reduce BIBL in transistors comprising high-mobility channel semiconductor material are commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
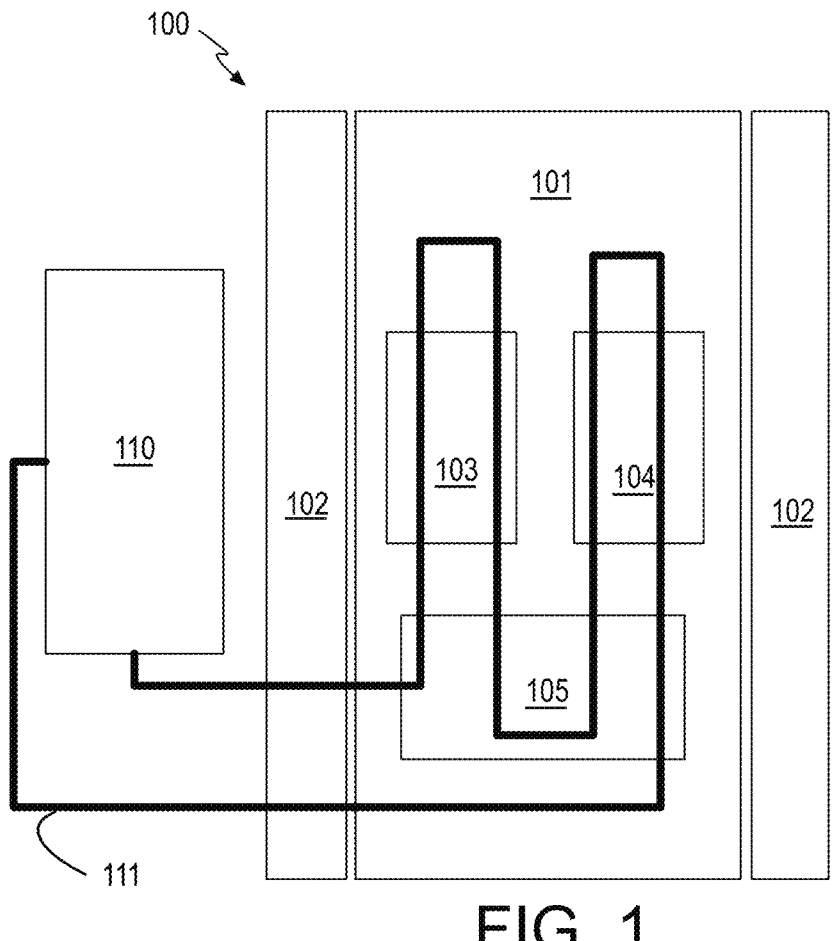
FIG. 1 illustrates a schematic of functional blocks in a microprocessor, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

FIG. 1 illustrates a schematic of functional blocks in a (micro)processor IC 100, in accordance with some embodiments. Processor IC 100 includes a core 101, which further includes shift registers 103, arithmetic logic unit (ALU) 104 and a first level (L1) cache 105. Processor IC 100 further includes a higher-level cache 102, external of core 101. Depending on implementation, higher-level cache 102 may be either an L2 cache, or an L3 cache if core 101 further comprises an L2 cache. In some exemplary embodiments, the logic circuitry in core 101 (e.g., shift registers 103 and ALU 104) is implemented with metal-oxide-semiconductor transistors (MOSFETs), and more specifically complementary MOS (CMOS) that includes PMOS and NMOS FETs. L1 cache 105 may be similarly implemented with FETs, but is distinguished from logic circuitry as the FETs are configured into an array of static random-access memory (SRAM) bit-cells to store bits for processing, for example by shift registers 103 and ALU 104.

In accordance with exemplary embodiments, processor IC 100 is actively cooled. Active cooling uses power to provide cooling either directly (e.g., thermoelectric device) or indirectly (e.g., with a chiller 110 coupled through a coolant loop 111). During operation of processor IC 100, the active cooling is to maintain at least some portion of IC 100 at a very low temperature, for example at least below 0° C., advantageously below −25° C., and more advantageously within the cryogenic temperature range (e.g., <−70 C). Although workload variation may result in thermal transients within the logic circuitry of core 101, at least L1 cache 105 may nevertheless be maintained at very low temperatures in a steady-state of IC operation. Accordingly, the MOS transistors in IC 100 can sustain a substantial boost in performance relative to their performance at higher (e.g., >>0° C.) temperatures. During very low temperature operation, MOS transistors display increased carrier (e.g., electron) mobility leading to substantially higher drive currents. This is particularly true for high mobility channel materials, such as those comprising Ge and III-V materials. The various circuitry in core 101 may be synergistically designed to further enhance the performance microprocessor 100 beyond what would otherwise be achieved through transistor-level performance gains associated with being integrated into a very low temperature platform. As described further below, for example, circuitry in core 101 may include transistors with non-silicon channel material that is electrically coupled to an underlying silicon substrate material through a pseudomorphic or metamorphic crystalline sub-channel material. Electrical leakage through the sub-channel material may be reduced by many orders of magnitude through junction isolation, which becomes increasingly more effective as the IC operating temperature decreases.

Figure 2:
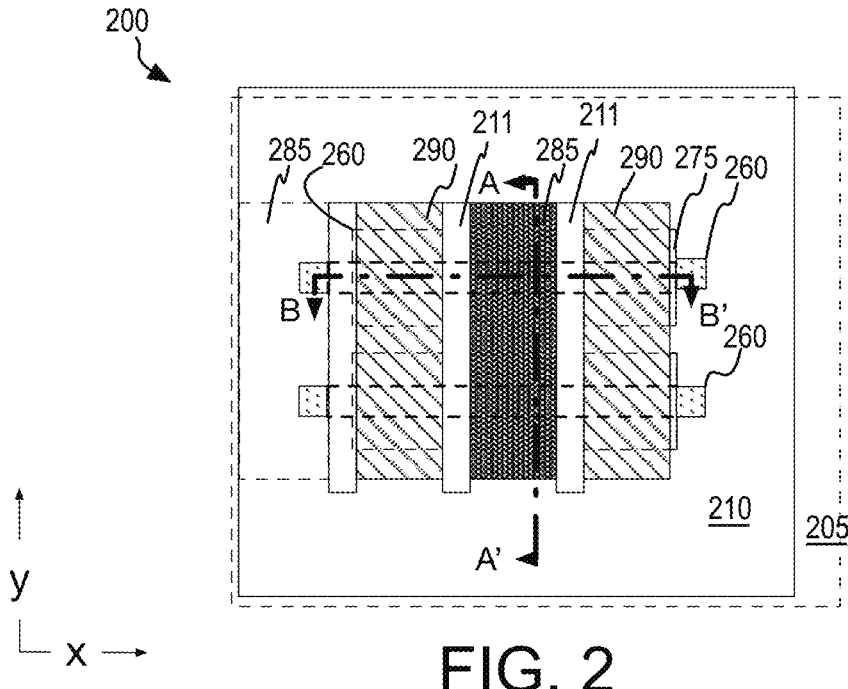
FIG. 2 is a plan view of a FET structure, accordance with some embodiments.

FIG. 2 is a plan view of field effect transistor (FET) structure 200, in accordance with some embodiments. A plurality of transistor structures 200 may be within one or more of the circuit blocks introduced in processor 100 (FIG. 1), for example. Transistor structure 200 includes a source terminal, a drain terminal, and a gate terminal, in accordance with some illustrative embodiments. In some embodiments, the source and drain terminals include semiconductor having the same conductivity type. In other embodiments, the source and drain terminals include semiconductor having complementary conductivity type (i.e., a tunnel FET, or TFET). The FET may also include a heterojunction (i.e., HFET) and in advantageous embodiments is a high electron mobility transistor (HEMT) because the channel material is other than silicon (i.e., non-silicon) and instead comprises Ge (or alloy thereof), a III-V alloy, or a III-N alloy. In FIG. 2, solid lines within transistor structure 200 denote salient materials formed overlying other material or structural features denoted in dashed lines within the transistor structure stratum. Heavy dot-dashed lines in FIG. 2 denote orthogonal planes A-A' and B-B' along which cross-sectional views are further provided as partial views of transistor structure 200 illustrated in FIGS. 3A, 3B, 4A, 4B, 5A, 5B, 6A and 6B, where the letter in the figure number corresponds to the cross-sectional plane designated by that same letter in FIG. 2.

FET structure 200 comprises two separate fins 260 extending from a surface of a substrate material 205. Active regions of substrate material 205 surround fins 260. An isolation dielectric material 210 surrounds fins 260. Dielectric material 210 may be of any dielectric composition such as, but not limited to, silicon dioxide, silicon nitride, silicon oxynitride, or any known low-k material having a relative permittivity below 4.0. Although two fins 260 are illustrated, non-planar FET structures may include any number of such semiconductor bodies. As described further below, a top portion of fins 260 include one or more layer or sheet of channel material over a base portion of sub-channel material that is between the channel material and substrate material 205.

In exemplary embodiments substrate material 205 is predominantly silicon, and advantageously substantially pure silicon. However, substrate material 205 may also have an alternative chemical composition (e.g., SiGe, etc.). The microstructure of substrate material 205 may also vary, but in some exemplary embodiments, substrate material 205 is substantially monocrystalline. For example, substrate material 205 may be a portion of a large format (e.g., 300-450 mm) semiconductor wafer with a thickness of 500-1000 μm, or more.

In accordance with some nanosheet finFET embodiments, fins 260 include a stack of channel material nanosheets and a gate electrode 285 surrounds each of the channel material nanosheets. In accordance with other finFET embodiments, gate electrode 285 straps over, and is adjacent to, a sidewall of only a single layer of channel material.

On opposite sides of gate electrode 285, source and drain semiconductor material 275 extends some width (e.g., y-dimension) beyond a sidewall of fins 260, overlapping the active regions of substrate material 205. In the illustrated embodiment, a source and drain metallization 290 is in contact with underlying source and drain semiconductor 275, which is further in contact with the underlying fin(s) 260. Source and drain semiconductor material 275 may be doped with electrically active impurities imparting n-type or p-type conductivity.

For some exemplary embodiments, both of the source and drain semiconductor material 275 is doped to the same conductivity type (e.g., n-type for NMOS and p-type for PMOS). In alternative embodiments (e.g., for a tunneling FET), source and drain semiconductor material 275 is doped to have complementary conductivity (e.g., n-type source and p-type drain). Source and drain semiconductor material 27 may be any semiconductor material compatible with channel semiconductor material associated with fins 260, such as, but not limited to, group IV semiconductors (e.g., Si, Ge, SiGe), group III-V semiconductors (e.g., InGaAs, InAs), group III-N semiconductors (e.g., InGaN), or (metal) oxide semiconductors.

An electrically insulating spacer dielectric 211 laterally separates gate electrode 285 from source/drain metallization 290 and/or source and drain semiconductor material 275. Each of gate electrode 285 and source/drain metallization 290 may have any chemical composition as embodiments herein are not limited in this respect. Gate electrode 285 may, for example, include any suitable work function metal(s), as wells as any suitable fill metal(s). Source/drain metallization 290 may, for example, include one or more metals that form an ohmic or tunneling junction with source and drain semiconductor material 275. Spacer dielectric 211 may be of any dielectric composition such as, but not limited to, silicon dioxide, silicon nitride, or silicon oxynitride, or any known low-k material having a relative permittivity below 4.0. Although only one gate electrode 285 is illustrated in solid line, an exemplary second gate electrode 285 is drawn in dashed line as being associated with an adjacent transistor structure. Spacer 211 also laterally separates this second gate electrode from source/drain metallization 290 and/or source and drain semiconductor material 275.

Figures 3A, 3B, 4A, 4B, 5A, 5B:
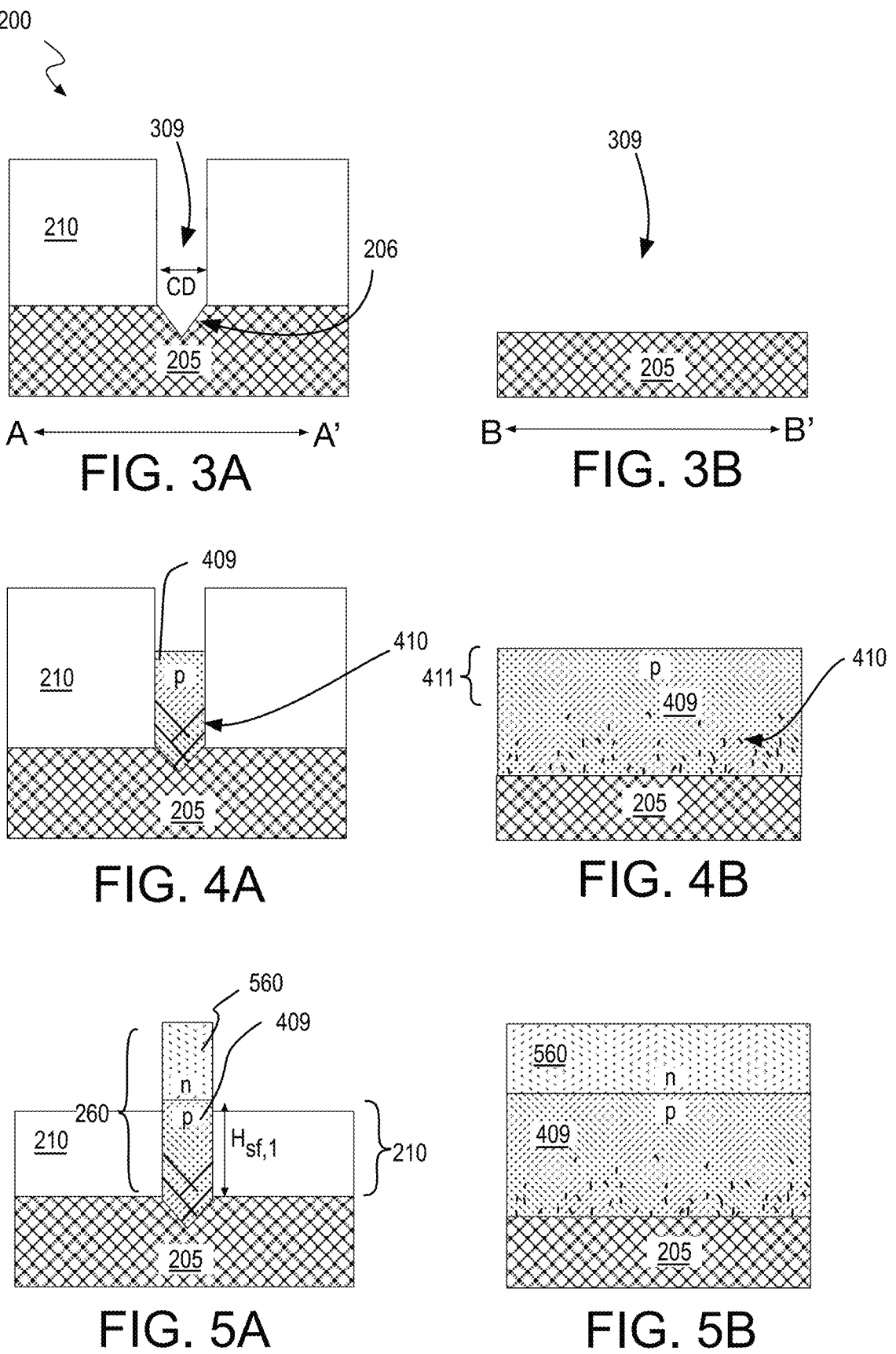
FIGS. 3A and 3B, 4A and 4B, 5A and 5B and 6A and 6B illustrate orthogonal cross-sectional views of the transistor structure illustrated in FIG. 2 evolving as some fabrication operations are performed, in accordance with some finFET embodiments.

As further illustrated in FIGS. 3A-5A and 3B-5B, transistor structures in accordance with some embodiments may be fabricated through heteroepitaxial growth processes. Such heteroepitaxial growth processes have the advantage of being able to directly form non-silicon channel materials upon a large format silicon substrate. As shown in FIGS. 3A and 3B, material layers of transistor structures 200 are epitaxially grown from a seeding portion of substrate material 205 that is located within a bottom of a trench 309. Trench 309 has been anistropically etched into isolation dielectric material 210, exposing a portion of substrate material 205 at the bottom of trench 309. In some embodiments, trench 309 has a CD of between 3 and 20 nm. However, the thickness of dielectric material 210 and CD of trench 309 may each be scaled as needed to maintain a workable aspect ratio for a predetermine fin height.

In some embodiments where substrate material 205 comprises silicon, substrate 205 is monocrystalline with the crystallographic orientation being (100) such that dielectric material 210 is on a (100) surface of substrate material 205. A substrate material comprising silicon or other cubic crystalline material may also have (111) or (110) crystallographic orientation. Other crystallographic orientations are also possible. For example, dielectric material 180 may be over a surface of substrate material 205 that has been miscut, or offcut 2-10° toward [110]. Such high index surfaces may facilitate nucleation of heteroepitaxial material, for example. In the example illustrated in FIG. 3A, substrate material 205 has been recess etched at the bottom of trench 309 to form a crystal facet 206 of any crystalline plane. In some examples where dielectric material 210 is on a (100) surface, crystal facet 206 is a (111) plane that may facilitate heteroepitaxial growth of a crystalline material having a different (e.g., larger) lattice constant than that of substrate material 205.

As further illustrated in FIGS. 4A and 4B, sub-channel material 409 is epitaxially grown selectively to the substrate seeding surface, at least partially back filling trench 409. In accordance with some exemplary embodiments, sub-channel material 409 is crystalline material that is contiguous with, but heteroepitaxial to, substrate material 205. In some embodiments, sub-channel material 409 is Ge, an alloy of Ge (e.g., $Si_xGe_{1-x}$), or a III-V alloy. In one specific example, sub-channel material 409 comprises both Ga and As and may be predominantly Ga and As (e.g., $Ga_xAs_{1-x}$). Sub-channel material 409 may further comprise In (e.g., $In_xGa_{1-x}As$). Sub-channel material 409 may have a large lattice mismatch with substrate material 205 and therefore relax into a metamorphic crystal upon relieving lattice strain through many crystal defects 410. Through aspect ratio trapping (ART), crystal defects 410 run out at the sidewall interface between sub-channel material 409 and amorphous dielectric material 210 so that the most defected material is proximal to substrate 205.

In accordance with some embodiments, fins comprising sub-channel material 409 have a dopant junction at the interface of the sub-channel material 409 and an overlying channel material. The dopant junction comprises one or more impurities that render sub-channel material 409 of a conductivity type that is complementary to the conductivity type of the channel material, thereby forming a P/N junction that is at least part of an isolation structure electrically isolating the channel material from substrate material 205. While such junction isolation can provide good electrical isolation for crystalline material of high quality, the defect concentration within sub-channel material 409 can limit the effectiveness of junction isolation. However, for embodiments where FET structure 200 is to be maintained at a very low temperature during operation, the P/N junction provides better electric isolation than at higher temperatures. Changes in a semiconductor material's fermi level as a function of temperature, can for example increase the effective thickness of the carrier depletion region of this P/N junction at lower temperatures. This wider depletion region can prevent carriers from reach the mid-gap states associated with the defects in sub-channel material 409, thereby improving a transistor's electrical isolation from substrate material 205.

In the example illustrated in FIGS. 4A and 4B, sub-channel material 409 includes one or more dopant impurities that impart p-type conductivity. The dopant impurities are at least within an upper sub-channel portion 411 distal from substrate material 205 and may be introduced during epitaxial growth. In some other exemplary embodiments, the p-type impurity dopant comprises C, which is advantageous for its low rate of diffusion within many crystal materials, such as a $Ga_xAs_{1-x}$ or $In_xGa_{1-x}As$. Although the dopant impurity concentration may vary, in some exemplary embodiments where sub-channel material 409 comprises Ga and As, at least upper sub-channel portion 411 comprises C at a concentration of between $10^{16}$ cm$^{-3}$ and $10^{19}$ cm$^{-3}$. Although p-type conductivity is illustrated in FIGS. 4A and 4B, in alternative embodiments sub-channel material 409 may be doped with one or more alternative impurities to impart n-type conductivity. In one example where sub-channel material 409 is a III-N alloy, the n-type impurity dopant comprises Si. Silicon atoms are an amphoteric dopant in most III-V materials, but can preferentially dope these materials n-type. Although the dopant impurity concentration may vary, in some exemplary embodiments where sub-channel material 409 comprising Ga and As, the n-type impurity within at least sub-channel portion 411 comprises Si at a concentration of between $10^{16}$ cm$^{-3}$ and $10^{19}$ cm$^{-3}$.

FIGS. 5A and 5B further illustrate a channel material 560 that has been epitaxially grown selectively to a seeding surface of sub-channel material 409. Channel material 560 may similarly partially back fill trench 409. In accordance with some exemplary embodiments, channel material 560 is crystalline material that is contiguous with sub-channel material 409. Channel material 560 may be pseudomorphic, as strained by sub-channel material 560. However, channel material 560 has a significantly lower defect density (i.e., better crystal quality) than sub-channel material 409.

In pseudomorphic embodiments, channel material 560 has different majority lattice constituents that sub-channel material 409. For such embodiments, the interface between channel material 560 and sub-channel material 409 is a heterojunction. For example, sub-channel material 409 may be a first III-V alloy while channel material 560 is a second III-V alloy. In one example, channel material 560 comprises predominantly In, Ga and As (e.g., a ternary alloy of $In_xGa_{1-x}As$) while sub-channel material 409 comprises predominantly Ga and As (e.g., the binary $Ga_xAs_{1-x}$). In another example, sub-channel material 409 is a III-V alloy (e.g., binary $Ga_xAs_{1-x}$) while channel material 560 comprises predominantly Ge (e.g., monocrystalline Ge), or a $Si_xGe_{1-x}$ alloy.

In other embodiments, channel material 560 has the same majority lattice constituents as sub-channel material 409. For such embodiments, the interface between channel material 560 and sub-channel material 409 is a homojunction. For example, sub-channel material 409 and channel material may both be the same III-V alloy.

At least a portion of channel material 560 proximal to sub-channel material 409 has a conductivity type complementary to that of sub-channel material portion 411. Hence, where sub-channel material portion 411 is p-type, channel material 560 is n-type. For embodiments where sub-channel material portion 411 is n-type, channel material 560 is p-type. The P/N junction therefore spans the interface between sub-channel material 409 and channel material 560. Channel material 560 may advantageously have a lower impurity concentration than sub-channel material 409. At a minimum, the p-type impurity concentration within channel material 560 is below intrinsic levels, and N-type impurity concentrations may be similarly near intrinsic impurity levels for highest carrier mobilities.

Following epitaxial growth of channel material 560, dielectric material 210 may be selectively recessed, for example with any suitable etch process to expose a sidewall of channel material 560. In the example shown in FIG. 5A, isolation dielectric 210 has been recessed relative to fin 260, exposing the entire sidewall of channel material 560 and an upper portion of sub-channel material 409.

Figures 6A, 6B:
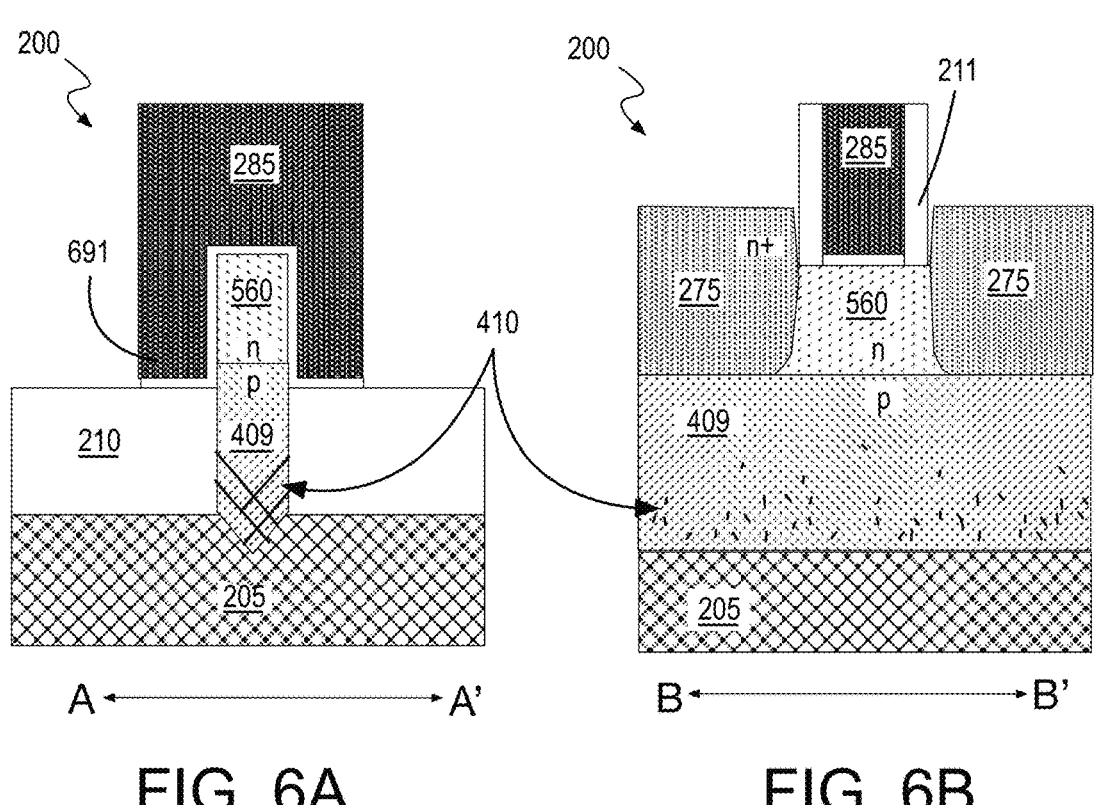

FIGS. 6A and 6B further illustrate gate electrode 285 adjacent to the sidewall of channel material 560. A gate insulator 691 is between gate electrode 285 and channel material 560. Gate insulator 691 may have a thickness less than 3 nm (e.g., 1.5-3.0 nm) and may include any number of material layers. In some exemplary embodiments, gate insulator 691 includes a high-k material. The high-k material composition may be any known to be suitable for a transistor gate insulator and having a bulk relative permittivity greater than 8. One exemplary high-k material has a composition of $M1O_x$ where M1 is a transition or rare earth metal. Examples include a metal oxide comprising predominantly hafnium (e.g., $HfO_x$), a metal oxide comprising predominantly aluminum (e.g., $AlO_x$), a metal oxide comprising predominantly magnesium (e.g., MgO), a metal oxide comprising predominantly lanthanum (e.g., $LaO_x$), or a metal oxide comprising predominantly zirconium (e.g., $ZrO_x$).

As shown in FIG. 6B, source and drain material 275 has been epitaxially grown on channel material 560. In the illustrated example, source and drain material 275 is crystalline material grown upon sub-channel material 409, for example with a heteroepitaxial process that may form pseudomorphic material. In exemplary embodiments where sub-channel material 409 is a first III-V alloy and channel material 560 is a second III-V alloy, source and drain material 275 is a third III-V alloy. In one example where channel material 560 comprises an InGaAs alloy, source and drain material 275 is an alloy with a greater In content, and may be binary $In_xAs1-x$. In other embodiments where channel material 560 comprises Ge, source and drain material 275 may also comprise Ge and may be substantially pure Ge.

Source and drain material 275 may be degenerately doped with a high concentration of impurities (e.g., donors for the illustrated n-type transistor embodiments, or acceptors for alternative p-type transistor embodiments). Any donor impurity or acceptor impurity known to be suitable for a particular composition may be within source and drain material 275 as embodiments herein are not limited in this respect. For embodiments where source and drain material 275 is in contact with sub-channel material 409, P/N junction isolation may again provide junction isolation between sub-channel material 409 and source and drain material 275 with a depletion region extending deep into sub-channel material 409, for example because a centration of acceptor impurities within sub-channel material 409 may be significantly lower than the donor impurity concentration within source and drain material 275. For embodiments where FET structure 200 is maintained at a very low temperature during operation of an IC, the P/N junction between sub-channel material 409 and source and drain material 275 again provides better electrical isolation than at higher temperatures.

Although FIG. 3A-6A illustrate a finFET with one layer of channel material, embodiments herein are similarly applicable to stacked nanosheet FETs. In the example shown in FIGS. 7A and 7B, a transistor structure 700 includes channel material nanoribbons 560A-560N extending between source and drain material 275. In some embodiments, channel material nanoribbons 560A-560N extend through source and drain material 375 as denoted by dashed lines in FIG. 7B. In alternative embodiments, channel material nanoribbons 560A-560N may be completely absent beyond dielectric spacer 211 with source and drain semiconductor material 275 then being a unitary body intervening between separate stacks of channel material nanoribbons 560A-560N.

Channel material nanoribbons 560A-560N may have any of the chemical compositions and microstructures described elsewhere herein for channel material 560 of finFET 200 (e.g., FIGS. 6A and 6B). Sub-channel material 409 may similarly have any of the chemical compositions and microstructures described above for finFET 200. Although channel material nanoribbons 560A-560N are illustrated as having a transverse width that is greater than their vertical (z) thickness, channel material nanoribbons 560A-560N may instead have a vertical thickness greater than, or substantially equal to, their transverse width. In some exemplary embodiments, transverse width is less than 3 nm (e.g., 1-2 nm).

Figures 7A, 7B:
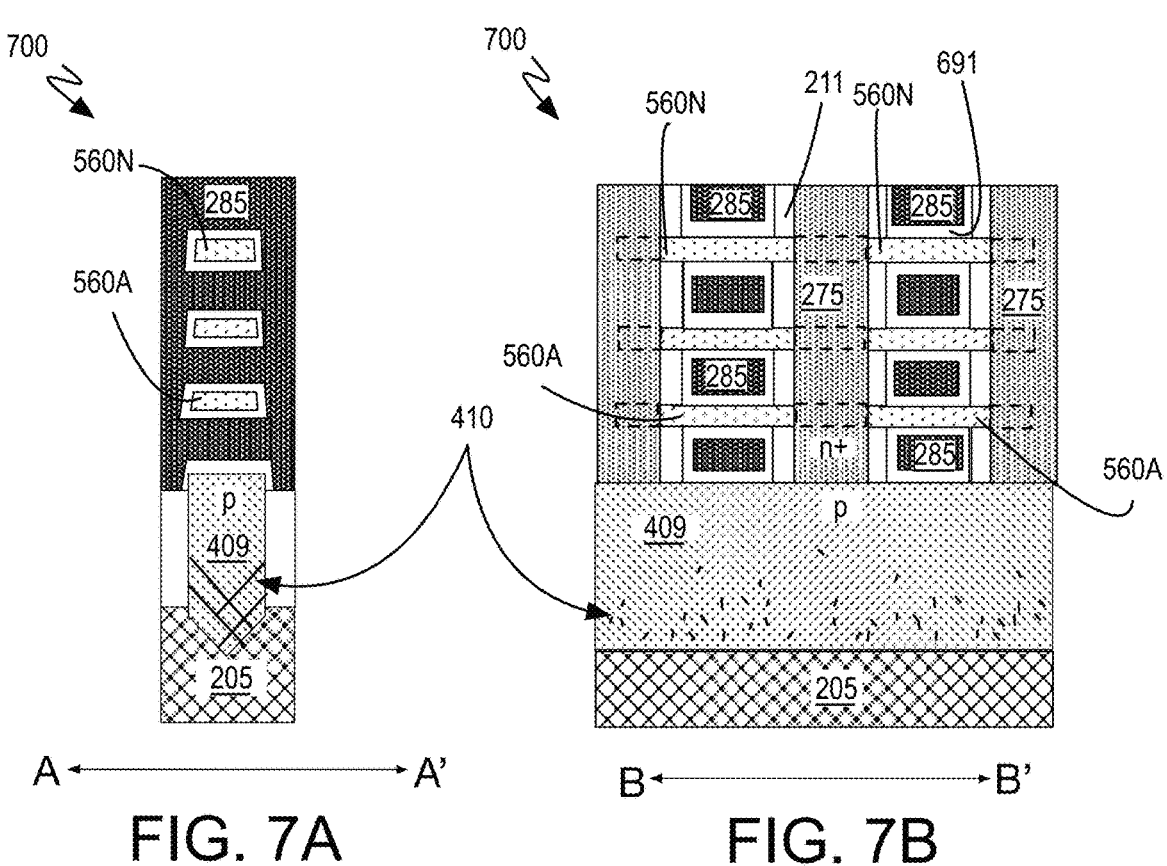
FIGS. 7A and 7B illustrate orthogonal cross-sectional views of the transistor structure illustrated in FIG. 2, in accordance with some alternative nanosheet FET embodiments.

As further shown in FIGS. 7A and 7B, gate electrode 285 and gate insulator 691 surround channel material nanoribbons 560A-560N, electrically isolating them from sub-channel material 409. However, junction isolation between sub-channel material 409 having a first conductivity type (e.g., p-type) and source and drain material 325 having a second conductivity type (e.g., n-type) again limits electrical leakage currents into substrate 205, particularly at very low temperatures.

Figure 8:
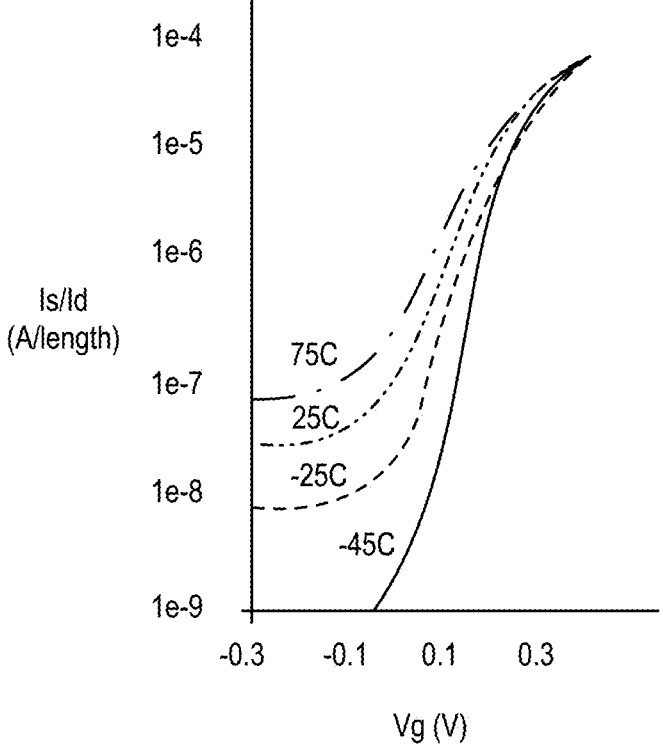
FIG. 8 illustrates transistor IV curves depicting body terminal leakage for transistor structures with high mobility channel material and junction isolated defected sub-channel material for different operating temperatures.

FIG. 8 illustrates transistor IV curves depicting body terminal leakage for transistor structures with high mobility channel material and junction isolated defected sub-channel material for different operating temperatures. In FIG. 8, gate voltage Vg is plotted to the x-axis, and source or drain current IS/Id is plotted to the y-axis. When operated at 75° C., a reference finFET with a high mobility channel material, a defected sub-channel material, and junction isolation, BIBL has a floor around 1e-7 A for an arbitrary length. Hence, even with junction isolation the high mobility channel material there comes at the expense of significant substrate leakage current attributable to the defect sub-channel material. At lower temperatures however, the substrate leakage floor is reduced, for example by an order of magnitude at –25° C. and significantly more than two orders of magnitude at –45° C.

Figure 9:
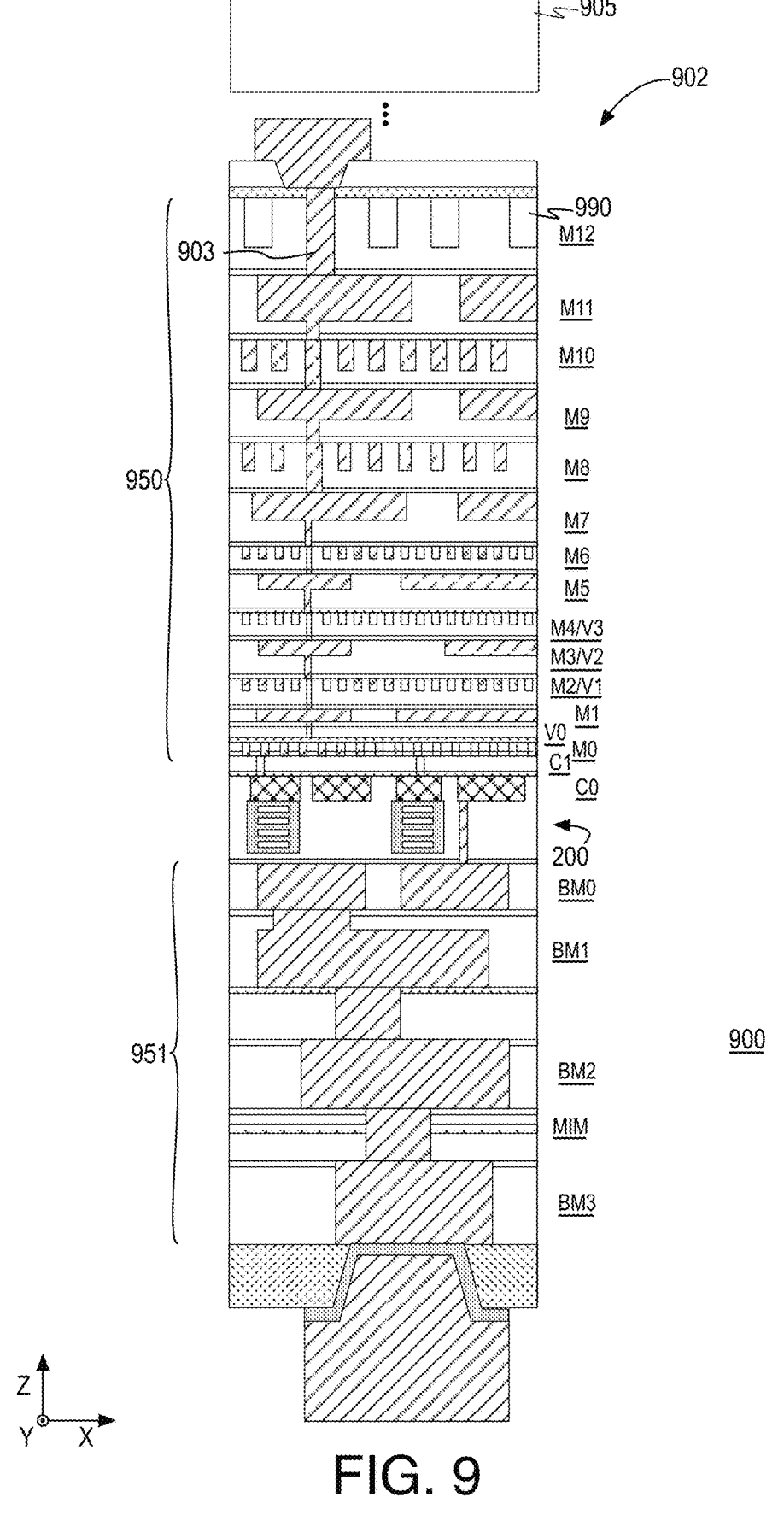
FIG. 9 illustrates a cross-sectional view of a low-temperature integrated circuit system with die-level active liquid phase cooling, in accordance with some embodiments.

FIG. 9 illustrates a cross-sectional view of a low temperature integrated circuit system 900 with die-level active liquid phase cooling, in accordance with some embodiments. In IC system 900, IC die 902 includes liquid coolant conveyance structures or components to otherwise remove heat from IC die 902 to achieve a very low operating temperature, for example at or below 0° C., for at least some transistors of IC die 902 during their operation.

In IC system 900, IC die 902 includes die level active liquid cooling as provided by microchannels 990. Microchannels 990 are to convey a heat transfer fluid to remove heat from IC die 902. The heat transfer fluid may be any suitable liquid or gas. In some embodiments, the heat transfer fluid has a cryogenic temperature operating window (e.g., about –70° C. to about –180° C.). In some embodiments, microchannels 990 are to convey liquid nitrogen operable to lower the temperature of at least a portion of IC die 902 to at or below about –50° C. In some other embodiments, the microchannels 990 are to convey one of helium-3, helium-4, hydrogen, neon, air, fluorine, argon, oxygen, or methane.

IC die 902 may include multiple microchannels 990 providing discrete channels or a network of interconnected channels. Microchannels 990 may have any pattern in the x-y plane such as a serpentine pattern, or the like. Microchannels 990 may be routed over an entirety of IC die 902 at some uniform density. Alternatively, microchannels 990 may be routed more densely over one portion of IC die 902, such as an SRAM portion of IC die 902, than another portion of IC die 902, such as a logic portion of IC die 902. Microchannels 990 place IC die 902 in fluid communication with a heat exchanger (not shown) external to IC die 902 that removes heat from the heat transfer fluid before its re-circulation through microchannels 990. The flow of fluid within microchannels 990 may be maintained by a pump or other means to provide a pressure differential between opposite ends of microchannels 990. The operation of a heat exchanger, pump, etc. may be controlled by a controller, for example.

In the illustrated embodiment, microchannels 990 are implemented at a metallization level M12. Metallization levels M0 through M11 may accordingly comprise and IC interconnect structure portion 950 over a first side of a plurality of transistor structures 200. Maintained at potentially cryogenic temperatures, substrate leakage through transistor structures 200 is much less than at standard temperature.

Microchannels 990 may be formed using any suitable technique(s), such as patterning and etch techniques to form voids followed by deposition, lamination or bonding techniques to enclose the voids. Microchannels 990 may be adjacent to a metallization feature 903, which may be an interface to a package level interconnect structure associated with a package 905. As shown in FIG. 9, levels of interconnect metallization features M0-M12 are over a front side of a device layer comprising transistors structures 200. Backside metallization levels 951 (e.g., BM0-BM3) are over a backside of the device layer and may couple electrical power into IC die 902, for example.

Figure 10:
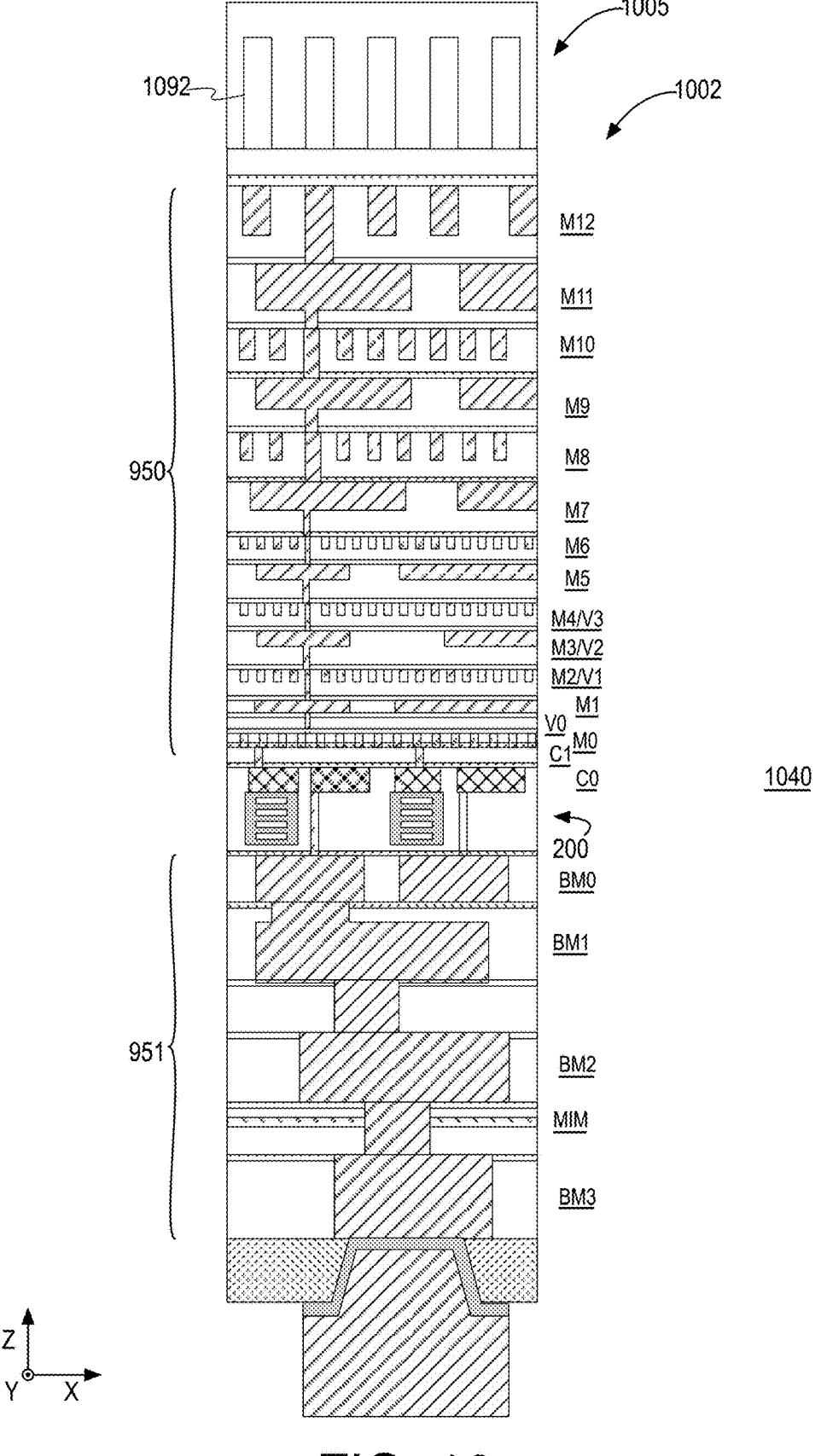
FIG. 10 illustrates a cross-sectional view of a low-temperature integrated circuit system with package-level active liquid phase cooling, in accordance with some embodiments.

FIG. 10 illustrates a cross-sectional view of a low temperature integrated circuit system 1040 with package-level active liquid phase cooling, in accordance with some embodiments. In IC system 1040, IC die 1002 includes active cooling structures or components to remove heat from IC die 1002 to achieve a steady-state operating temperature within at least some portion of IC die 1002 at a very low temperature, such as 0° C. or any other operating temperature discussed herein.

In IC system 1040, IC die package 1005 includes a liquid cooling structure having microchannels 1092. Microchannels 1092 are to similarly convey a heat transfer fluid to remove heat from IC die 1002. The heat transfer fluid may be any of the liquid or gas examples described as suitable for microchannels 990. Microchannels 1092 are to couple to a heat exchanger (not shown) external of IC die package 1005. In the illustrated embodiment, IC die package 1005 is an active chiller that may be operable at cryogenic temperatures and mounted to IC die 1002 according to any suitable techniques, such as a bonding or solder interconnection.

Figure 11:
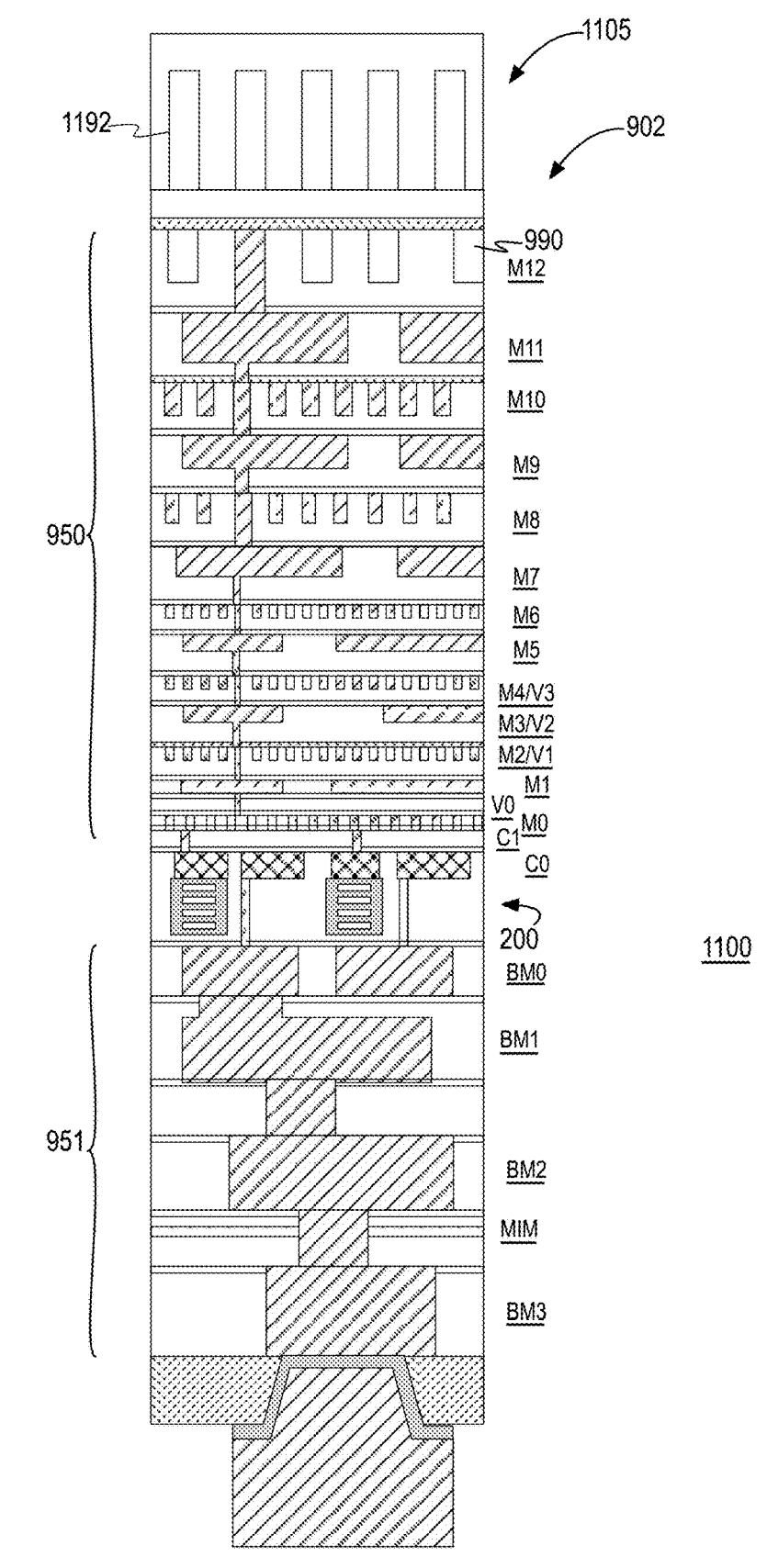
FIG. 11 illustrates a cross-sectional view of a low-temperature integrated circuit system with die-level and package-level active liquid phase cooling, in accordance with some embodiments.

FIG. 11 illustrates a cross-sectional view of a low temperature integrated circuit system 1100 having both die-level and package-level active liquid phase cooling, in accordance with embodiments. In IC system 1100, IC die 902 includes active cooling structures or components as provided by both microchannels 990 and IC die package 1105. In some embodiments, the heat transfer fluid deployed in microchannels 990 and microchannels 1192 are coupled to the same pump and heat exchanger systems. In such embodiments, the heat transfer fluid conveyed in microchannels 990 and 1192 are part of the same active cooling loop. In other embodiments, the heat transfer fluids in each of microchannels 990 and 1192 are maintained as separate active cooling loops.

Figure 12:
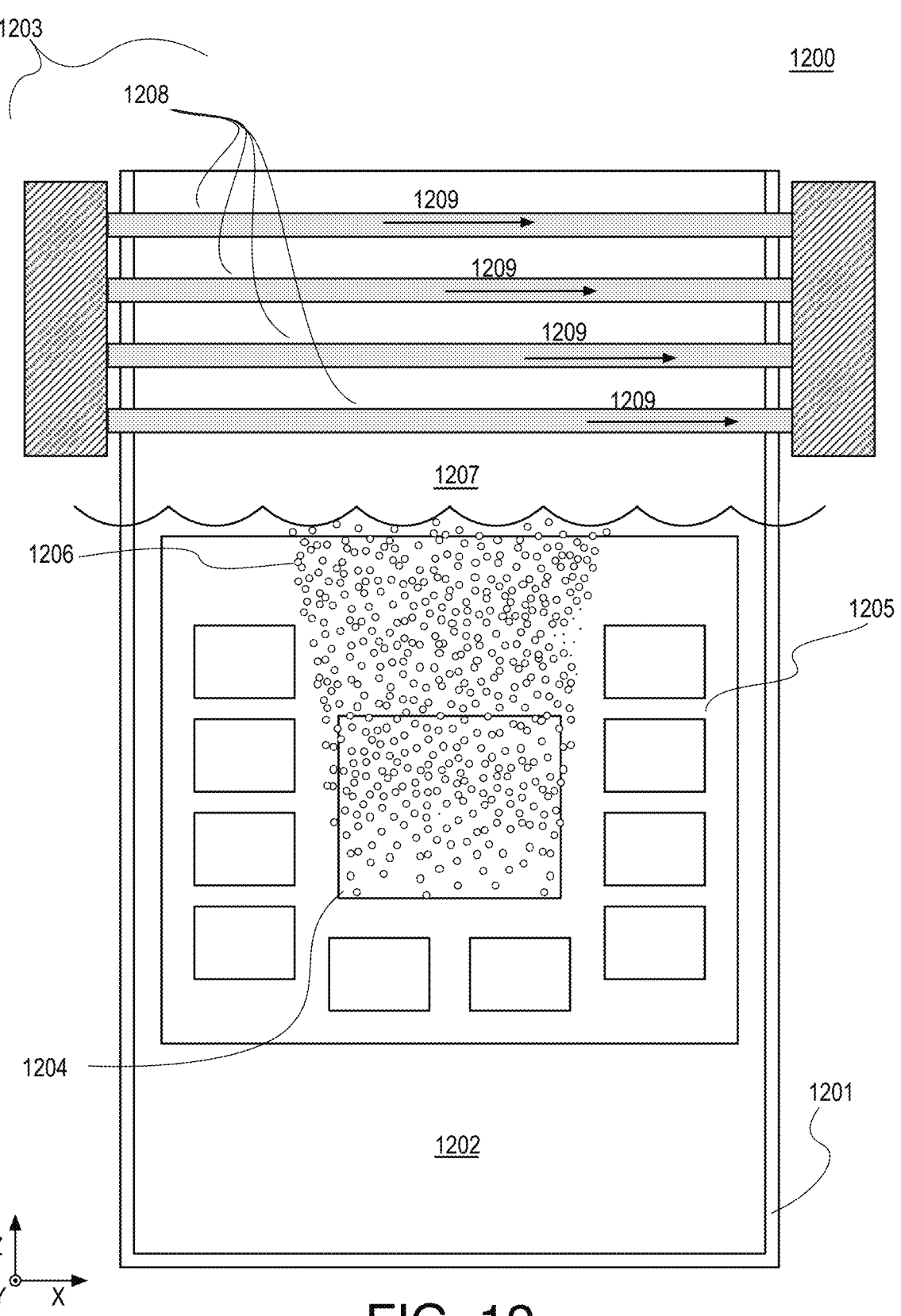
FIG. 12 illustrates a schematic of a liquid phase immersion cooling system for cryogenic operation of an integrated circuit die comprising transistors with junction isolated defected subfins, in accordance with some embodiments.

FIG. 12 illustrates a schematic of a liquid phase immersion cooling system 1200 for cryogenic operation of an integrated circuit die comprising an L1 cache comprising bit-cells in accordance with one or more embodiments described elsewhere herein. As shown, two-phase immersion cooling system 1200 includes a fluid containment structure 1201, a low-boiling point liquid 1202 within fluid containment structure 1201, and a condensation structure 1203 at least partially within fluid containment structure 1201. As used herein, the term low-boiling point liquid indicates a liquid having a boiling point in the very low (e.g., cryogenic) temperature ranges above. In some embodiments, the low-boiling point liquid is one of nitrogen (LN2), helium-3, helium-4, hydrogen, neon, air, fluorine, argon, oxygen, or methane.

In operation, a heat source 1204 (such as an IC die including any of transistor structures 200 or 700 described above) is immersed in low-boiling point liquid 1202. In some embodiments, IC die or IC systems deployed in two-phase immersion cooling system 1200 do not include fluid microchannels. In alternative embodiments, such die-level or package-level active cooling structures may be used in concert with two-phase immersion cooling system 1200. Hence, any IC die, for example as described elsewhere herein, may be attached to a host substrate 1205. Host substrate 1205 may be coupled to a power supply (not shown) and may be partially or completely submerged in low-boiling point liquid 1202.

In operation, the heat produced by heat source 1204 vaporizes low-boiling point liquid 1202 illustrated as bubbles 1206, which may collect as a vapor portion 1207 within fluid containment structure 1201. Condensation structure 1203 may extend through vapor portion 1207. In some embodiments, condensation structure 1203 is a heat exchanger having a number of tubes 1208 with a cooling fluid (i.e., a fluid colder than the condensation point of vapor portion 1207) flow shown as arrows 1209 through tubes 1208 to condense vapor portion 1207 back to low-boiling point liquid 1202.

Figure 13:
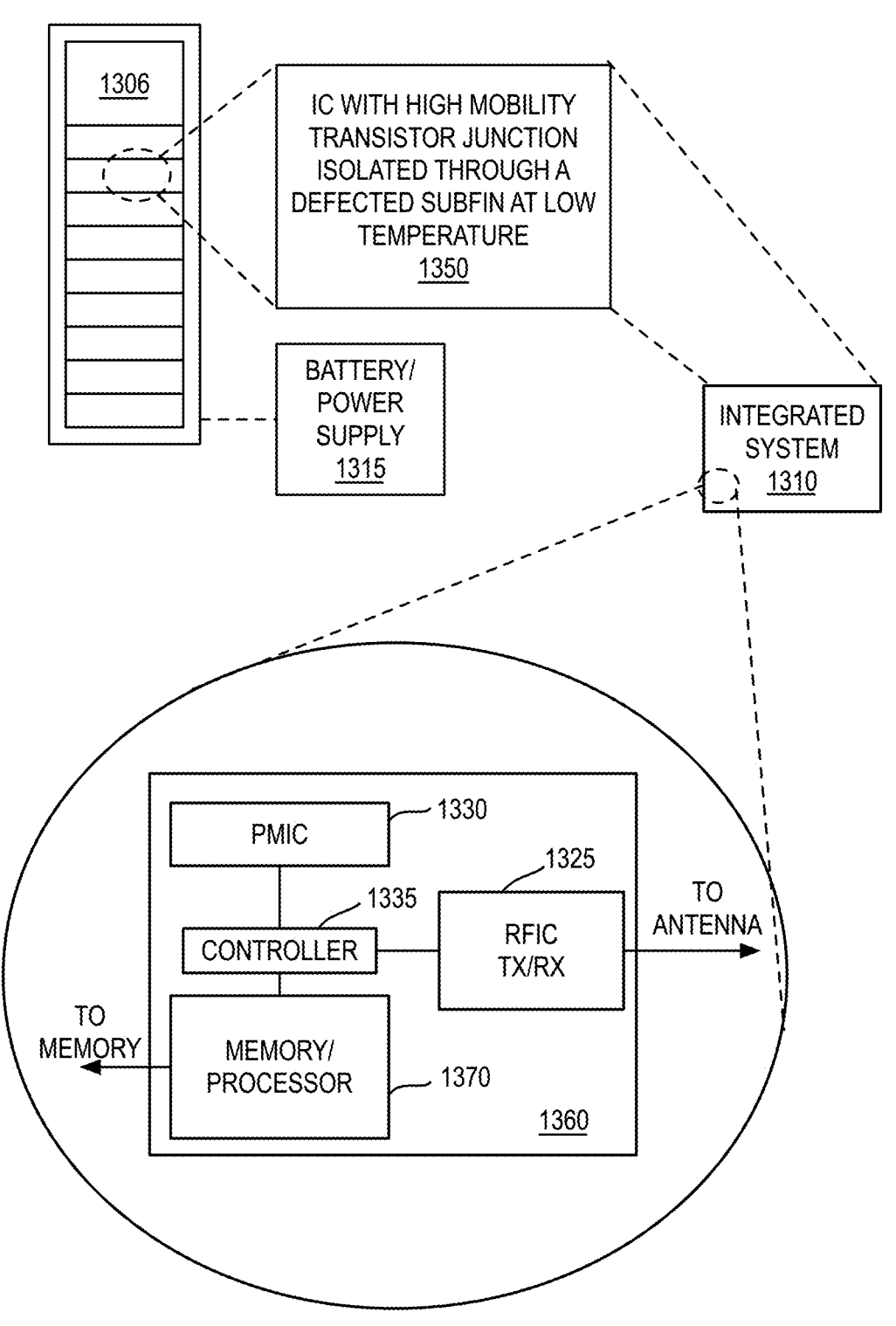
FIG. 13 illustrates a schematic of a data server machine including an actively liquid-phase cooled integrated circuit comprising transistors with junction isolated defected subfins, in accordance with some embodiments.

FIG. 13 illustrates a schematic of a data server machine including an actively cooled integrated circuit with transistors comprising high mobility channel material, a defected sub-channel material and junction isolation, in accordance with one or more embodiments described elsewhere herein. Server machine 1306 may be any commercial server, for example, including any number of high-performance computing platforms disposed within a rack and networked together for electronic data processing, which in the exemplary embodiment includes one or more devices 1350 having an integrated circuit that includes transistors comprising high mobility channel material, a defected sub-channel material and junction isolation.

Also as shown, server machine 1306 includes a battery and/or power supply 1315 to provide power to devices 1350, and to provide, in some embodiments power delivery functions such as power regulation. Devices 1350 may be deployed as part of a package-level integrated system 1310. In the exemplary embodiment, integrated system 1310 includes an integrated circuitry 1370 (labeled "Memory/Processor") includes at least one memory array (e.g., RAM), and/or at least one processor core (e.g., a microprocessor, a multi-core microprocessor, or graphics processor, or the like) having the characteristics discussed herein. In an embodiment, integrated circuitry 1370 is a microprocessor including an SRAM L1 cache memory. Integrated circuitry 1370 may be further coupled to (e.g., communicatively coupled to) a board, a substrate, or an interposer 1360 along with, one or more of a power management integrated circuit (PMIC) 1330, RF (wireless) integrated circuitry (RFIC) 1325 including a wideband RF (wireless) transmitter and/or receiver (TX/RX) (e.g., including a digital baseband and an analog front end module further comprises a power amplifier on a transmit path and a low noise amplifier on a receive path), and a controller 1335.

Figure 14:
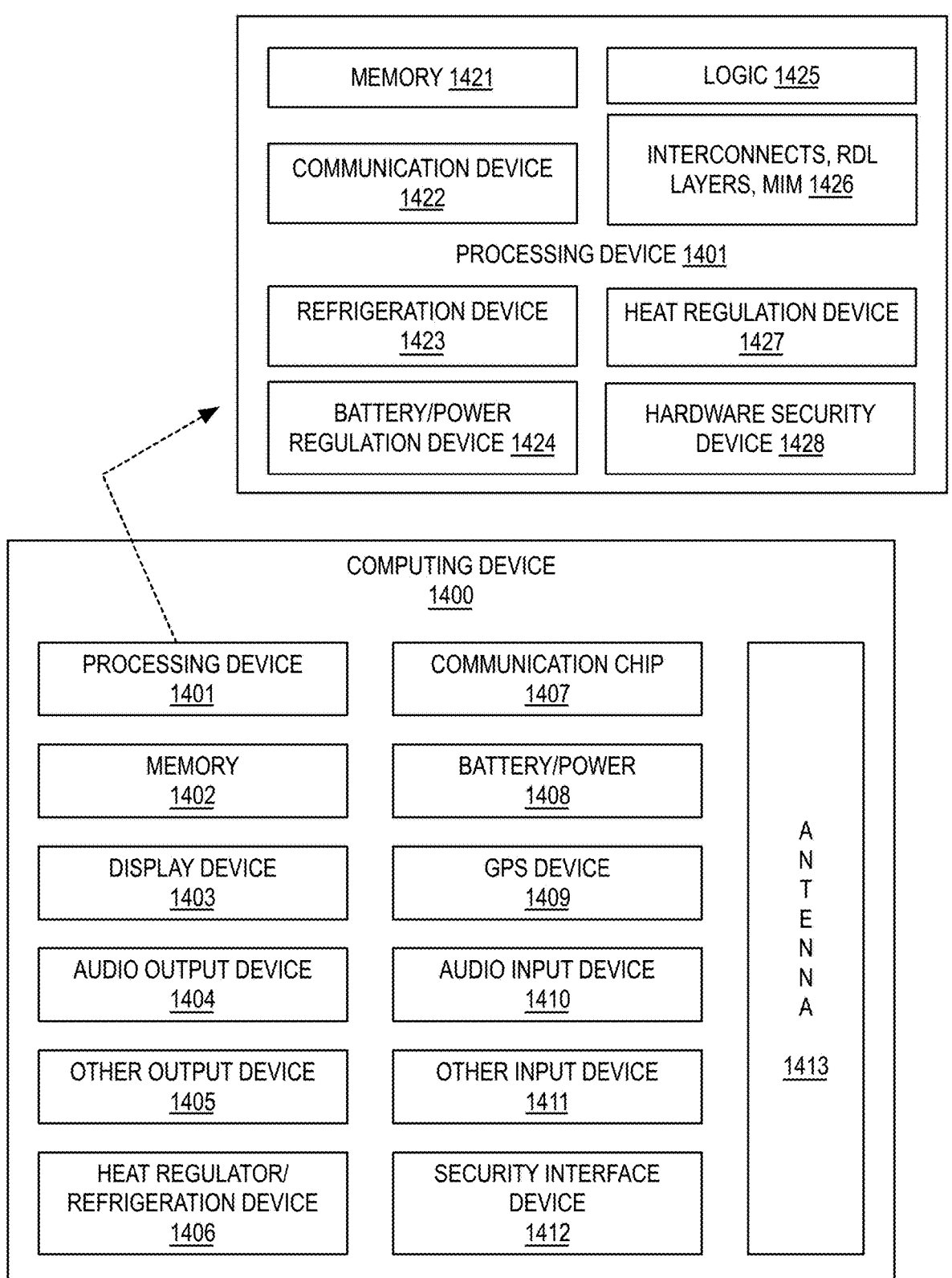
FIG. 14 is a block diagram of a cryogenically cooled computing device in accordance with some embodiments.

FIG. 14 is a block diagram of a cryogenically cooled computing device 1400 in accordance with some embodiments. For example, one or more components of computing device 1400 may include any of the devices or structures discussed elsewhere herein. A number of components are illustrated in FIG. 14 as included in computing device 1400, but any one or more of these components may be omitted or duplicated, as suitable for the application. In some embodiments, some or all of the components included in computing device 1400 may be attached to one or more printed circuit boards (e.g., a motherboard). In some embodiments, various ones of these components may be fabricated onto a single system-on-a-chip (SoC) die. Additionally, in various embodiments, computing device 1400 may not include one or more of the components illustrated in FIG. 14, but computing device 1400 may include interface circuitry for coupling to the one or more components. For example, computing device 1400 may not include a display device 1403, but may include display device interface circuitry (e.g., a connector and driver circuitry) to which display device 1403 may be coupled.

Computing device 1400 may include a processing device 1401 (e.g., one or more processing devices). As used herein, the term processing device or processor indicates a device that processes electronic data from registers and/or memory to transform that electronic data into other electronic data that may be stored in registers and/or memory. Processing device 1401 may include a memory 1421, a communication device 1422, a refrigeration/active cooling device 1423, a battery/power regulation device 1424, logic 1425, interconnects 1426 (i.e., optionally including redistribution layers (RDL) or metal-insulator-metal (MIM) devices), a heat regulation device 1427, and a hardware security device 1428.

Processing device 1401 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Processing device 1401 may include a memory 1402, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 1421 includes memory that shares a die with processing device 1402. This memory may be used as cache memory and may include embedded dynamic random access memory (eDRAM) or spin transfer torque magnetic random-access memory (STT-M RAM).

Computing device 1400 may include a heat regulation/refrigeration device 1406. Heat regulation/refrigeration device 1406 may maintain processing device 1402 (and/or other components of computing device 1400) at a predetermined low temperature during operation. This predetermined low temperature may be any temperature discussed elsewhere herein.

In some embodiments, computing device 1400 may include a communication chip 1407 (e.g., one or more communication chips). For example, the communication chip 1407 may be configured for managing wireless communications for the transfer of data to and from computing device 1400. The term "wireless" and its derivatives may be used to describe circuits, devices, systems, methods, techniques, communications channels, etc., that may communicate data through the use of modulated electromagnetic radiation through a nonsolid medium.

Communication chip 1407 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1407 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1407 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1407 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1407 may operate in accordance with other wireless protocols in other embodiments. Computing device 1400 may include an antenna 1413 to facilitate wireless communications and/or to receive other wireless communications (such as AM or FM radio transmissions).

In some embodiments, communication chip 1407 may manage wired communications, such as electrical, optical, or any other suitable communication protocols (e.g., the Ethernet). As noted above, communication chip 1407 may include multiple communication chips. For instance, a first communication chip 1407 may be dedicated to shorter-range wireless communications such as Wi-Fi or Bluetooth, and a second communication chip 1407 may be dedicated to longer-range wireless communications such as GPS, EDGE, GPRS, CDMA, WiMAX, LTE, EV-DO, or others. In some embodiments, a first communication chip 1407 may be dedicated to wireless communications, and a second communication chip 1407 may be dedicated to wired communications.

Computing device 1400 may include battery/power circuitry 1408. Battery/power circuitry 1408 may include one or more energy storage devices (e.g., batteries or capacitors) and/or circuitry for coupling components of computing device 1400 to an energy source separate from computing device 1400 (e.g., AC line power).

Computing device 1400 may include a display device 1403 (or corresponding interface circuitry, as discussed above). Display device 1403 may include any visual indicators, such as a heads-up display, a computer monitor, a projector, a touchscreen display, a liquid crystal display (LCD), a light-emitting diode display, or a flat panel display, for example.

Computing device 1400 may include an audio output device 1404 (or corresponding interface circuitry, as discussed above). Audio output device 1404 may include any device that generates an audible indicator, such as speakers, headsets, or earbuds, for example.

Computing device 1400 may include an audio input device 1410 (or corresponding interface circuitry, as discussed above). Audio input device 1410 may include any device that generates a signal representative of a sound, such as microphones, microphone arrays, or digital instruments (e.g., instruments having a musical instrument digital interface (MIDI) output).

Computing device 1400 may include a global positioning system (GPS) device 1409 (or corresponding interface circuitry, as discussed above). GPS device 1409 may be in communication with a satellite-based system and may receive a location of computing device 1400, as known in the art.

Computing device 1400 may include another output device 1405 (or corresponding interface circuitry, as discussed above). Examples include an audio codec, a video codec, a printer, a wired or wireless transmitter for providing information to other devices, or an additional storage device.

Computing device 1400 may include another input device 1411 (or corresponding interface circuitry, as discussed above). Examples may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1400 may include a security interface device 1412. Security interface device 1412 may include any device that provides security measures for computing device 1400 such as intrusion detection, biometric validation, security encode or decode, managing access lists, malware detection, or spyware detection, Computing device 1400, or a subset of its components, may have any appropriate form factor, such as a hand-held or mobile computing device (e.g., a cell phone, a smart phone, a mobile internet device, a music player, a tablet computer, a laptop computer, a netbook computer, an ultra-book computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

It will be recognized that embodiments are not limited to the specific examples described, but can be practiced with modification and alteration without departing from the scope of the appended claims. For example, the above embodiments may include specific combinations of features as further provided below.

In first examples, an integrated circuit (IC) die comprises a plurality of transistor structures. Individual ones of the transistor structures comprise a channel material of a first conductivity type comprising Ge or a III-V alloy. The channel material is in contact with a sub-channel material of a second, complementary, conductivity type also comprising Ge or a III-V alloy. The sub-channel material is between the channel material and a substrate layer of monocrystalline silicon. The transistor structures comprise a gate stack, a source, and a drain coupled to the channel material, and a cooling structure to maintain at least the some of the transistor structures at a temperature below –25° C. during operation of the IC die.

In second examples, for any of the first examples the channel material is n-type, and the sub-channel material comprises a p-type dopant within at least a portion of the sub-channel material proximal to an interface with the channel material.

In third examples, for any of the second examples the transistor structure comprises a homojunction at the interface of the channel material and the sub-channel material, and a concentration of the p-type dopant varies across the homojunction.

In fourth examples for any of the second or third examples the channel material comprises In, Ga and As, and the p-type dopant is C.

In fifth examples, for any of the first through second examples the transistor structure comprises a heterojunction at the interface of the channel material and the sub-channel material, and a concentration of the p-type dopant varies across the heterojunction.

In sixth examples, for any of the fifth examples the channel material comprises In, Ga and As, and the sub-channel material comprises more Ga than the channel material.

In seventh examples, for any of the sixth examples the sub-channel material comprises predominantly Ga and As.

In eighth examples, for any of the seventh examples the p-type dopant is C.

In ninth examples, for any of the first through eighth examples the channel material comprises predominantly G, and the sub-channel material comprises an n-type impurity dopant.

In tenth examples, for any of first through ninth examples the integrated cooling structure comprises a plurality of microchannels within the IC die, the microchannels to convey a heat transfer liquid that maintains at least some of the transistors at a temperature below –50° C. during operation of the IC die.

In eleventh examples, a computer system comprises an integrated circuit (IC) die. The IC die comprises a plurality of transistor structures. Individual ones of the transistor structures comprise a channel material of a first conductivity type comprising Ge or a III-V alloy. The channel material is in contact with a sub-channel material of a second, complementary, conductivity type also comprising Ge or a III-V alloy. The sub-channel material is between the channel material and a substrate layer of monocrystalline silicon. The transistor structures comprise a gate, a source, and a drain coupled to the channel material. The system comprises an integrated cooling structure to maintain at least some of the transistor structures at a temperature below –25° C. during operation of the IC die.

In twelfth examples, for any of the eleventh examples the channel material is n-type, the sub-channel material comprises a p-type dopant within at least a portion of the sub-channel material proximal to an interface with the channel material, and the transistor structure comprises a homojunction at the interface of the channel material and the sub-channel material with a concentration of the p-type dopant varying across the homojunction.

In thirteenth examples, for any of twelfth examples the channel material comprises In, Ga and As, and the p-type dopant is C.

In fourteenth examples, for any of the twelfth t examples the channel material is n-type, the sub-channel material comprises a p-type dopant within at least a portion of the sub-channel material proximal to an interface with the channel material. The transistor structure comprises a heterojunction at the interface of the channel material and the sub-channel material, and a concentration of the p-type dopant varies across the heterojunction. The channel material comprises In, Ga and As. The sub-channel material comprises predominantly Ga and As, and the p-type dopant is C.

In fifteenth examples, a method of fabricating an IC die comprises forming a trench within a dielectric material layer, the trench exposing a substrate layer of monocrystalline silicon. The method comprises forming a sub-channel material comprising Ge or a III-V alloy within the trench. Forming the sub-channel material comprises doping at least a portion of the sub-channel material to a first conductivity type. The method comprises forming a channel material of a second, complementary, conductivity type on the sub-channel material, the channel material comprising Ge or a III-V alloy. The method comprises forming a gate, a source, and a drain coupled to the channel material. The method comprises forming microchannels within the integrated circuit (IC) die, the microchannels to convey a liquid at a temperature of less than –50° C.

In sixteenth examples, for any of the fifteenth examples forming the channel material comprises epitaxially growing a crystal comprising In, Ga and As.

In seventeenth examples, for any of the fifteenth through sixteenth examples forming the sub-channel material comprises epitaxially growing a pseudomorphic crystal comprising predominantly Ga and As.

In eighteenth examples, for any of the seventeenth examples forming the sub-channel material comprises doping with C a portion of the sub-channel material proximal to an interface with the channel material.

In nineteenth examples, for any of the fifteenth through eighteenth examples forming microchannels within the IC die comprises forming the microchannels over a frontside or a backside of a device layer comprising the transistors.

In twentieth examples, for any of the nineteenth examples the method comprises forming a plurality of interconnect metallization levels over the frontside or the backside of the device layer, the interconnect metallization levels between the device layer and the microchannels.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) die, comprising:
a plurality of transistor structures, wherein individual ones of the transistor structures comprise:
a channel material comprising Ge or a III-V alloy;
a sub-channel material comprising Ge or a III-V alloy, wherein the sub-channel material is between the channel material and a substrate layer of monocrystalline silicon; and
a gate stack, a source, and a drain coupled to the channel material, wherein at least one of the channel material, the source, or the drain is of a first conductivity type and is in direct physical contact with the sub-channel material, and wherein the sub-channel material is of a second, complementary, conductivity type; and
a cooling structure comprising a plurality of microchannels within the IC die, the microchannels below, or laterally adjacent to, an interconnect metallization feature of the IC die, and the microchannels to convey a heat transfer liquid to maintain at least some of the transistor structures at a temperature below −25° C. during operation of the IC die.

2. The IC die of claim 1, wherein:
the channel material is in direct physical contact with the sub-channel material;
the channel material is n-type; and
the sub-channel material comprises a p-type dopant within at least a portion of the sub-channel material proximal to an interface with the channel material.

3. The IC die of claim 2, wherein the individual ones of the transistor structures comprise a homojunction at the interface of the channel material and the sub-channel material, and wherein a concentration of the p-type dopant varies across the homojunction.

4. The IC die of claim 2, wherein:
the channel material comprises In, Ga and As; and
the p-type dopant is C.

5. The IC die of claim 2, wherein the individual ones of the transistor structures comprise a heterojunction at the interface of the channel material and the sub-channel material, and wherein a concentration of the p-type dopant varies across the heterojunction.

6. The IC die of claim 5, wherein:
the channel material comprises In, Ga and As; and
the sub-channel material comprises more Ga than the channel material.

7. The IC die of claim 6, wherein the sub-channel material comprises predominantly Ga and As.

8. The IC die of claim 7, wherein the p-type dopant is C.

9. The IC die of claim 1, wherein:
the channel material comprises predominantly Ge; and
the sub-channel material comprises an n-type impurity dopant.

10. The IC die of claim 1, wherein the plurality of microchannels are embedded within one or more dielectric materials of an interconnect metallization stack within the IC die, and wherein the heat transfer liquid conveyed by the microchannels is a cryogenic liquid that is to maintain at least some of the transistor structures at a temperature below −50° C. during operation of the IC die.

11. A computer system, comprising:
an integrated circuit (IC) die, comprising:
a plurality of transistor structures, wherein individual ones of the transistor structures comprise:
a channel material comprising Ge or a III-V alloy;
a sub-channel material also comprising Ge or a III-V alloy, wherein the sub-channel material is between the channel material and a substrate layer of monocrystalline silicon; and
a gate, a source, and a drain coupled to the channel material, wherein at least one of the channel material, the source, or the drain has a first conductivity type and is in direct physical contact with the sub-channel material, and wherein the sub-channel material has a second, complementary, conductivity type; and
an IC-die integrated cooling structure comprising a plurality of first microchannels within the IC die, the first microchannels to convey a first heat transfer liquid; and
an IC die package attached to the IC die, wherein the IC die package comprises a package integrated liquid cooling structure comprising a plurality of second microchannels to convey a second heat transfer liquid, wherein the IC-die integrated cooling structure and the package integrated liquid cooling structure are to maintain at least some of the transistor structures at a temperature below −25° C. during operation of the IC die.

12. The computer system of claim 11, wherein:
the channel material is in direct physical contact with the sub-channel material;
the channel material is n-type;
the sub-channel material comprises a p-type dopant within at least a portion of the sub-channel material proximal to an interface with the channel material; and
the individual ones of the transistor structures comprise a homojunction at the interface of the channel material and the sub-channel material with a concentration of the p-type dopant varying across the homojunction.

13. The computer system of claim 12, wherein:
the channel material comprises In, Ga and As; and
the p-type dopant is C.

14. The computer system of claim 12, wherein:
the channel material is n-type;
the sub-channel material comprises a p-type dopant within at least a portion of the sub-channel material proximal to an interface with the channel material;
the transistor structure comprises a heterojunction at the interface of the channel material and the sub-channel material with a concentration of the p-type dopant
varying across the heterojunction;

the channel material comprises In, Ga and As;

the sub-channel material comprises predominantly Ga
and As; and the p-type dopant is C.

15. The IC die of claim 10, wherein the plurality of
microchannels are over a front side of the plurality of
transistor structures and wherein the IC die further com-
prises another interconnect metallization stack over a back
side of the plurality of transistor structures.

16. The computer system of claim 11, wherein the plu-
rality of first microchannels are below, or laterally adjacent
to, an interconnect metallization feature of the IC die.

17. The computer system of claim 16, wherein the plu-
rality of first microchannels are over a front side of the
plurality of transistor structures and wherein the IC die
further comprises another interconnect metallization stack
over a back side of the plurality of transistor structures.

18. The computer system of claim 17, wherein the pack-
age integrated liquid cooling structure is attached to the front
side of the IC die, and wherein the first and second heat
transfer liquids are maintained as separate active cooling
loops.

* * * * *